United States Patent
Yoon et al.

(10) Patent No.: US 10,588,199 B2
(45) Date of Patent: Mar. 10, 2020

(54) DIGITAL ADDRESSABLE LIGHTING INTERFACE (DALI) AND POWER DEVICE COMPRISING SAME

(71) Applicant: LG INNOTEK CO., LTD., Seoul (KR)

(72) Inventors: Dong Keun Yoon, Seoul (KR); Seok Yoon, Seoul (KR); Jun Ho Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/302,252

(22) PCT Filed: May 16, 2017

(86) PCT No.: PCT/KR2017/005028
§ 371 (c)(1),
(2) Date: Nov. 16, 2018

(87) PCT Pub. No.: WO2017/204481
PCT Pub. Date: Nov. 30, 2017

(65) Prior Publication Data
US 2019/0223274 A1 Jul. 18, 2019

(30) Foreign Application Priority Data
May 23, 2016 (KR) .................... 10-2016-0063052

(51) Int. Cl.
H05B 33/08 (2006.01)
H05B 37/02 (2006.01)

(52) U.S. Cl.
CPC .............. *H05B 37/0254* (2013.01)

(58) Field of Classification Search
None
See application file for complete search history.

(56) References Cited

U.S. PATENT DOCUMENTS

| 4,755,697 A | 7/1988 | Kinzer |
| 2003/0036807 A1 | 2/2003 | Fosler |

(Continued)

FOREIGN PATENT DOCUMENTS

| KR | 10-2010-0094421 | 8/2010 |
| KR | 10-2015-0145683 | 12/2015 |

(Continued)

OTHER PUBLICATIONS

International Search issued in Application Report (with English Translation) and Written Opinion dated Aug. 29, 2017 issued in Application No. PCT/KR2017/005028.

(Continued)

*Primary Examiner* — Dedei K Hammond
(74) *Attorney, Agent, or Firm* — Ked & Associates, LLP (57) ABSTRACT

The present invention relates to a Digital Addressable Lighting Interface (DALI) interface and a power device comprising the same. The present invention can provide a DALI interface comprising: a first limiting circuit unit for outputting a limited current based on a DALI transmission signal and a DALI reception signal; and a gate drive circuit unit for generating, based on the limited current, a drain-source voltage that is used for generating a DALI signal in accordance with the DALI standard. As a result, the present invention can generate a signal complying with the DALI standard even under various voltage and current conditions of a DALI master.

15 Claims, 7 Drawing Sheets

(56) References Cited

U.S. PATENT DOCUMENTS

| | | |
|---|---|---|
| 2005/0152440 A1 | 7/2005 | Beij et al. |
| 2010/0207539 A1 | 8/2010 | Haeusser |
| 2010/0246082 A1 | 9/2010 | Chitta et al. |
| 2015/0076994 A1* | 3/2015 | Rezeanu ............ H05B 37/0254 |
| | | 315/155 |
| 2016/0143106 A1* | 5/2016 | Scheidegger ...... H05B 33/0845 |
| | | 315/291 |
| 2016/0174340 A1 | 6/2016 | Rezeanu |

FOREIGN PATENT DOCUMENTS

| | | |
|---|---|---|
| WO | WO 03/081777 | 10/2003 |
| WO | WO 2013/159133 | 10/2013 |
| WO | WO 2014/060922 | 4/2014 |

OTHER PUBLICATIONS

European Search Report dated Dec. 6, 2019 issued in EP Application No. 17803000.3.

* cited by examiner

| DALI Master Condition | $V_{DALI}$ = 17V, $I_{DALI}$ = 250mA(max) | | | $V_{DALI}$ = 15V, $I_{DALI}$ = 8mA(max) | | |
|---|---|---|---|---|---|---|
| Parameter | Falling time | Rising time | Low-Pulse Width | Falling time | Rising time | Low-Pulse Width |
| Standard | 3us ~ 25us | 3us ~ 25us | 416us±20% | 3us ~ 25us | 3us ~ 25us | 416us±20% |
| Result Value | 16.6us | 15.2us | 424.6us | 7.2us | 19.8us | 447.4us |
| Result Waveform |  |  |  |  |  |  |

DIGITAL ADDRESSABLE LIGHTING INTERFACE (DALI) AND POWER DEVICE COMPRISING SAME

CROSS-REFERENCE TO RELATED PATENT APPLICATIONS

This application is a U.S. National Stage Application under 35 U.S.C. § 371 of PCT Application No. PCT/KR2017/005028, filed May 16, 2017, which claims priority to Korean Patent Application No. 10-2016-0063052, filed May 23, 2016, whose entire disclosures are hereby incorporated by reference.

TECHNICAL FIELD

The present invention relates to a Digital Addressable Lighting Interface (DALI) interface and a power device including the same.

BACKGROUND ART

A light emitting diode (LED) is widely used as a light source due to low power consumption, high luminance, and the like. In particular, recent light emitting devices have been employed as backlight devices for lighting devices and large liquid crystal displays (LCDs). Such light emitting devices are provided in the form of a package that is easy to be mounted on various devices such as lighting devices. A lighting system using a Digital Addressable Lighting Interface (DALI) protocol has been proposed as an approach that can integrate and control a plurality of lighting devices as the proportion of use of LEDs for illumination increases in various aspects. The DALI protocol uses half-duplex asynchronous communication to receive a state of a lamp, a state of a stabilizer, a dimming level, and the like as query signals, and enables monitoring through a DALI master.

The lighting system using the DALI protocol includes a power device for transmitting signals between a terminal device and a DALI master. The signal is a signal conforming to the DALI standard, which is a lighting control standard. In this case, the power device includes a DALI interface for generating a DALI signal.

DISCLOSURE OF THE INVENTION

Technical Problem

An aspect of the present invention is directed to provide a DALI interface for generating a signal suitable for the DALI standard even in various voltage and current conditions of a DALI master, and a power device including the same.

Another aspect of the present invention is directed to provide a DALI interface for generating a signal suitable for the DALI standard even when there is characteristic deviation in components of the DALI interface, and a power device including the same.

A further another aspect of the present invention is directed to provide a DALI interface capable of adjusting waveform characteristics of a DALI signal.

In addition to the technical problems of the present invention mentioned above, other features and advantages of the present invention will be described hereinafter, or it will be apparent to those skilled in the art from the description and the explanation.

Technical Solution

As a means for solving the problems, a Digital Addressable Lighting Interface (DALI) interface includes: a first limiting circuit unit for outputting a limited current based on a DALI transmission signal and a DALI reception signal; and a gate drive circuit unit for generating, based on the limited current, a drain-source voltage that is used for generating a DALI signal in accordance with a DALI standard.

In the DALI interface according to another embodiment of the present invention, the gate drive circuit unit may include a first transistor for generating the drain-source voltage.

In the DALI interface according to another embodiment of the present invention, the gate drive circuit unit may include a parallel capacitor connected to a gate electrode and a drain electrode of the first transistor and adjusting a falling time and a rising time of the DALI signal.

In the DALI interface according to another embodiment of the present invention, the gate drive circuit unit may include a second transistor for controlling the first transistor.

In the DALI interface according to another embodiment of the present invention, the gate drive circuit unit may include a Zener diode for allowing a constant voltage to be inputted with regard to the limited current.

In the DALI interface according to another embodiment of the present invention, the first limiting circuit unit may include a photocoupler for receiving the DALI transmission signal.

As another means for solving the problems, a Digital Addressable Lighting Interface (DALI) interface includes: a first limiting current unit including a first photocoupler, and a first diode having a cathode electrode connected to a collector electrode of the first photocoupler; and a gate drive circuit unit including a Zener diode having a cathode electrode connected to an emitter electrode of the first photocoupler, a second diode having an anode electrode connected to a cathode electrode of the Zener diode, and a first transistor having a gate electrode connected to a cathode electrode of the second diode, a drain electrode connected to an anode electrode of the first diode, and a source electrode connected to a ground electrode.

As another means for solving the problems, the gate drive circuit unit may include a parallel capacitor having one end connected to the gate electrode of the first transistor and the other end connected to the drain electrode of the first transistor.

As another means for solving the problems, the gate drive circuit unit may include a second transistor having a base electrode connected to the anode electrode of the second diode, an emitter electrode connected to the gate electrode of the first transistor, and a collector electrode connected to the ground electrode.

As another means for solving the problems, the first limiting circuit unit may include a first smoothing capacitor having one end connected to the collector electrode of the first photocoupler and the cathode electrode of the first diode and the other end connected to the ground electrode.

As another means for solving the problems, a power device includes: a microcontroller for outputting a Digital Addressable Lighting Interface (DALI) transmission signal and receiving a DALI reception signal; and a DALI interface including a first limiting circuit unit for outputting a DALI signal in accordance with a DALI standard and outputting a limited current based on the DALI transmission signal and the DALI reception signal, and a gate drive circuit unit for generating, based on the limited current, a drain-source voltage that is used for generating the DALI signal in accordance with the DALI standard.

As another means for solving the problems, a lighting system includes: a terminal device for outputting a control signal for controlling a lighting device; a power device including a first limiting circuit unit for outputting a DALI signal in accordance with a DALI standard based on the control signal and outputting a limited current based on a DALI transmission signal and a DALI reception signal, and a gate drive circuit unit for generating, based on the limited current, a drain-source voltage that is used for generating a DALI signal in accordance with the DALI standard, and a DALI master for controlling a lighting device based on the DALI signal.

Advantageous Effects

A DALI interface according to an embodiment of the present invention may generate a signal suitable for the DALI standard even in various voltage and current conditions of a DALI master.

A DALI interface according to an embodiment of the present invention may generate a signal suitable for the DALI standard even when there is characteristic deviation in components of the DALI interface.

A DALI interface according to an embodiment of the present invention is capable of adjusting waveform characteristics of a DALI signal.

In addition, other features and advantages of the present invention may be newly recognized through embodiments of the present invention.

BEST MODE

Embodiments of the present disclosure will be described with reference to the accompanying drawings in such a manner that the embodiments may be easily carried out by those skilled in the art to which the present disclosure pertains. The same reference numerals are used to denote the same elements throughout the specification.

The effects and features, and methods of achieving the effects and features will become apparent from embodiments described below in detail with reference to the accompanying drawings. However, the present invention is not limited to the following embodiments and may be realized in various forms. The present embodiments are provided so that this disclosure will be thorough and complete and will fully convey the scope of the present invention to those skilled in the art. The scope of the invention should be determined by reasonable interpretation of the appended claims.

In the following descriptions of the embodiments, detailed descriptions of well-known functions or constructions will be omitted since they would obscure the invention in unnecessary detail. The terms as used herein are those general terms currently widely used in the art by taking into account functions in the present disclosure, but the terms may vary according to the intention of those of ordinary skill in the art, precedents, or the like in the art. Thus, the terms used herein should be understood based on the overall description of the present invention.

Spatially relative terms "under, below, beneath," "lower," "on, above," "upper," and the like may be used to readily describe a relationship between a device or elements and another device or elements as illustrated in the drawings. Spatially relative terms should be understood as including different directions of the elements during use or operation as well as directions shown in the drawings. For example, when inverting an element shown in the drawings, an element described as "below" or "beneath" another element may be placed "above" another element. Thus, the exemplary term "below" can include both downward and upward directions.

The terminology used herein is for the purpose of illustrating embodiments and is not intended to limit the present disclosure. As used herein, the singular form is intended to include the plural forms as well, unless context clearly indicates otherwise. It will also be understood that the terms "comprises" and/or "includes", when used herein, specify the presence of stated elements, steps, operations, and/or devices, but do not preclude the presence or addition of other elements, steps, operations, and/or devices unless otherwise defined.

Figure 1:
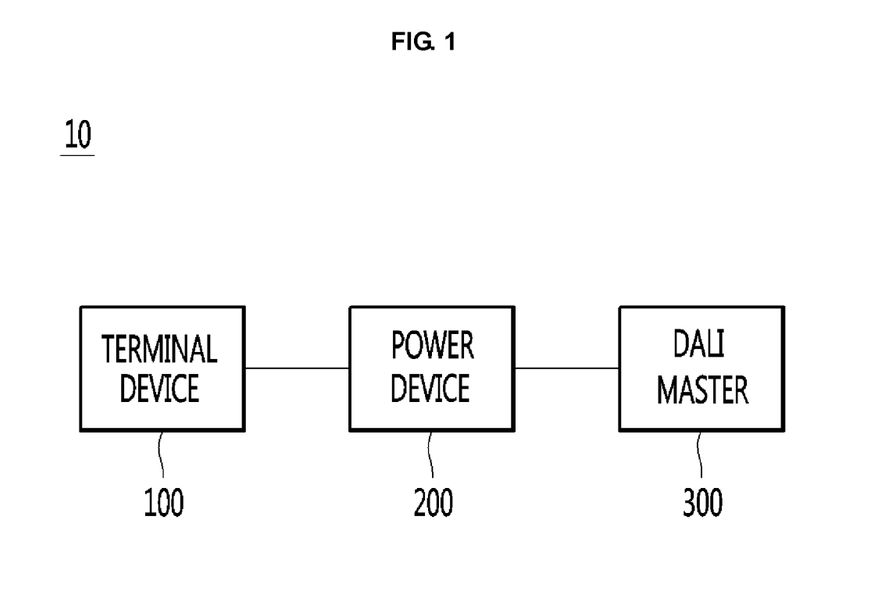
FIG. 1 is a block diagram of a lighting system according to an embodiment of the present invention.
Figure 2:
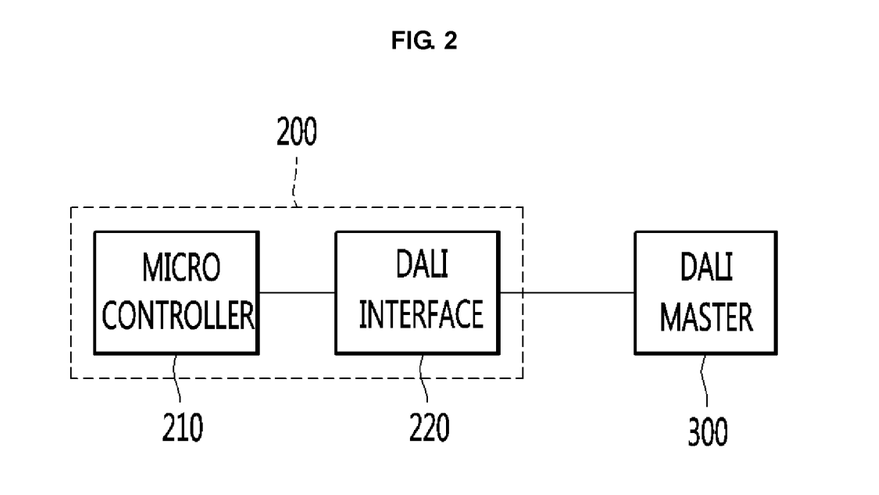
FIG. 2 is a block diagram of a power device according to an embodiment of the present invention.

FIG. 1 is a block diagram of a lighting system according to an embodiment of the present invention, and FIG. 2 is a block diagram of a power device according to an embodiment of the present invention.

Referring to FIG. 1, a lighting system 10 according to an embodiment of the present invention may include a terminal device 100. The terminal device 100 may transmit or receive control information for a plurality of lighting devices to or from a DALI master 300 according to environmental conditions such as time, temperature, or humidity. In addition, the terminal device 100 may transmit, to the DALI master 300, control information directly set or inputted by a user. More specifically, the terminal device 100 may provide a DALI transmission (Tx) signal to the power device 200 so as to provide the control information to the DALI master 300. In addition, the terminal device 100 may receive a DALI signal generated by the DALI master 300 through the power device 200 in the form of a DALI reception (Rx) signal. The terminal device 100 may be a server or a PC.

The lighting system 10 according to the embodiment of the present invention may include the DALI master 300. The DALI master 300 may provide control information provided from the terminal device 100 to a lighting device (not illustrated) including a DALI communication module. The DALI master 300 may transmit control information to a lighting device (not illustrated) directly or using a plurality of DALI slaves (not illustrated). More specifically, the DALI master 300 may receive, from the power device 200, a DALI signal including control information of a lighting device (not illustrated). The DALI master 300 may provide a control signal capable of controlling a lighting device (not illustrated) by using the received DALI signal.

In addition, the DALI master 300 may have various voltage and current conditions according to products. For example, the voltage condition of the DALI master 300 may be 9.5 V to 22.5 V. The current condition of the DALI master 300 may be 8 mA to 250 mA. Therefore, the DALI master 300 may have various voltage and current conditions.

Referring to FIGS. 1 and 2, the lighting system 10 according to the embodiment of the present invention may include a power device 200. The power device 200 may generate the control signal of the terminal device 100 as a DALI signal suitable for the DALI standard and provide the control signal to the DALI master 300. More specifically, the power device 200 may include a microcontroller 210. The microcontroller 210 may generate a DALI transmission (Tx) signal according to control information from the terminal device 100. The power device 200 may include a DALI interface 220. The DALI interface 220 may provide the DALI signal to the DALI master 300 by using the DALI transmission (Tx) signal. In addition, the DALI interface 220 may generate the DALI reception (Rx) signal by using the DALI signal provided from the DALI master 300, and provide the DALI reception (Rx) signal to the terminal device 100.

The DALI interface 220 according to the embodiment of the present invention may generate the DALI signal suitable for the DALI standard even in various voltage and current conditions of the DALI master 300. In addition, the DALI interface 220 according to the embodiment of the present invention may generate the DALI signal suitable for the DALI standard even when there is characteristic deviation in components of the DALI interface. In addition, the DALI interface 220 according to the embodiment of the present invention is capable of adjusting waveform characteristics of the DALI signal.

Figure 3:
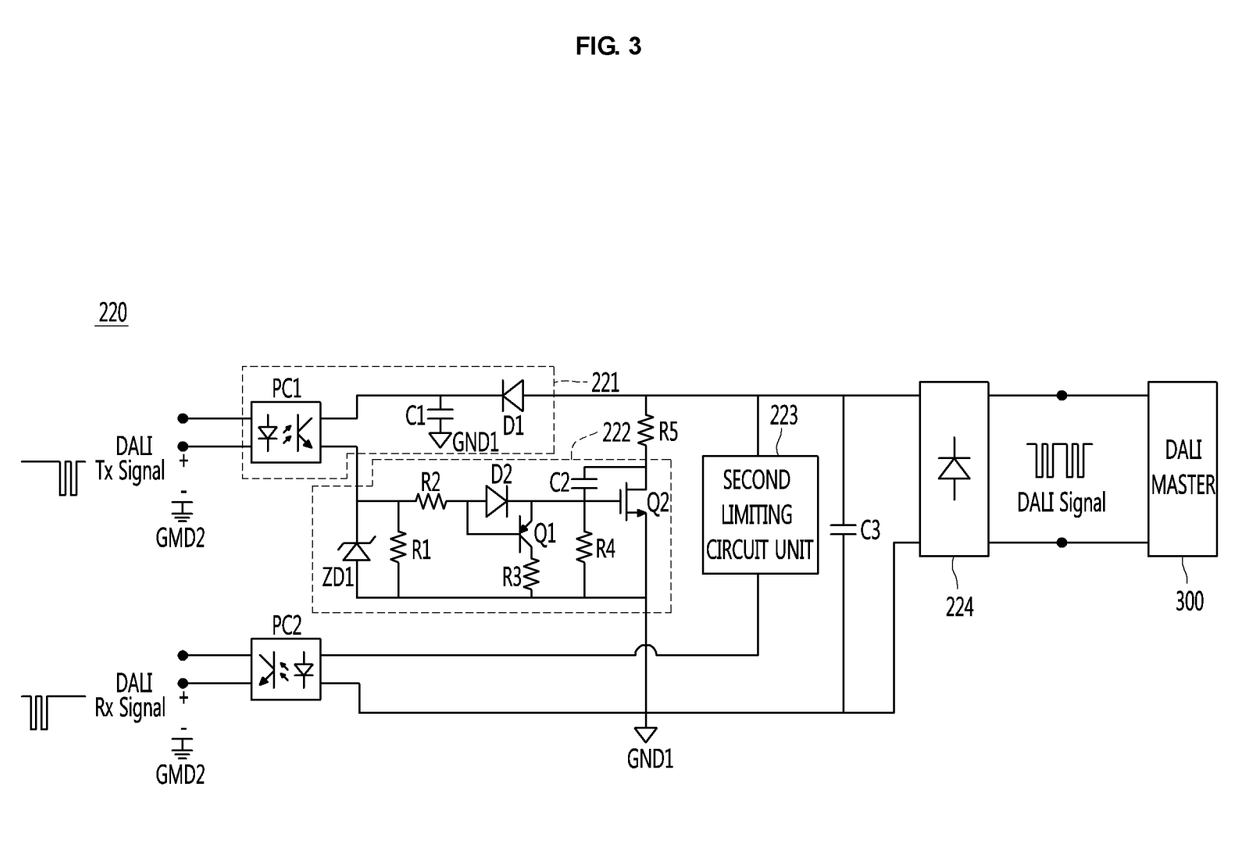
FIG. 3 is a circuit diagram of a DALI interface according to an embodiment of the present invention.

FIG. 3 is a circuit diagram of the DALI according to the embodiment of the present invention.

Referring to FIG. 3, the DALI interface 220 according to the embodiment may include a limiting circuit unit 221. The first limiting circuit unit 221 may provide a limited current to a gate drive circuit unit 222 based on the DALI transmission (Tx) signal or the DALI reception (Rx) signal.

In addition, the first limiting circuit unit 221 may include a first photocoupler PC1 that receives the DALI transmission (Tx) signal inputted by the microcontroller 210. In the first photocoupler PC1, an anode electrode and a cathode electrode may be connected to the microcontroller 210. The first photocoupler PC1 may have a collector electrode connected to one end of a first smoothing capacitor C1 and a cathode electrode of a first diode D1. The first photocoupler PC1 may have an emitter electrode connected to a cathode electrode of a Zener diode ZD1 of the gate drive circuit unit 222. The first limiting circuit unit 221 may include the first smoothing capacitor C1. The other end of the first smoothing capacitor C1 may be connected to a first ground electrode GND1. The first limiting circuit unit 221 may include the first diode D1. An anode electrode of the first diode D1 may be connected to one end of a fifth resistor R5 and a rectification unit 224.

The DALI interface 220 according to the embodiment of the present invention may include the gate drive circuit unit 222. The gate drive circuit unit 222 may be controlled by the DALI transmission (Tx) signal. The gate drive circuit unit 222 may generate a drain-source voltage $V_{ds}$ by using the limited current of the first limiting circuit unit 221. The drain-source voltage $V_{ds}$ of the gate drive circuit unit 222 may be made to generate the DALI signal suitable for the DALI protocol.

In addition, the gate drive circuit unit 222 may include the Zener diode ZD1. The Zener diode ZD1 may constantly maintain a maximum value of an input voltage $V_{ZD1}$ inputted to the gate drive circuit unit 222. Therefore, even when a wide range of a supply voltage of the DALI master 300 is provided or a deviation occurs in components of the first photocoupler PC1, the Zener diode ZD1 allows the gate drive circuit unit 222 to operate in a constant input condition. The Zener diode ZD1 may have a cathode electrode connected to a first resistor R1, a second resistor R2, and the emitter diode of the first photocoupler PC1. In addition, the Zener diode ZD1 may have an anode electrode connected to the first resistor R1, a third resistor R3, a fourth resistor R4, and a collector electrode of a first transistor Q1. In addition, the gate drive circuit unit 222 may include the first resistor R1. The first resistor R1 may be connected in parallel to the Zener diode ZD1. That is, the first resistor R1 may have one end connected to the cathode electrode of the Zener diode ZD1 and the other end connected to the anode electrode of the Zener diode ZD1. The gate drive circuit unit 222 may include the second resistor R2. The second resistor R2 may have one end connected to the first resistor, the cathode electrode of the Zener diode ZD1, and the emitter electrode of the first photocoupler PC1. The second resistor R2 may have the other end connected to an anode electrode of a second diode D2 and a base electrode of the first transistor Q1. The gate drive circuit unit 222 may include the second diode D2. The second diode D2 may have the anode electrode connected to the other end of the second resistor R2 and the base electrode of the first transistor Q1. The second diode D2 may have a cathode electrode connected to the emitter electrode of the first transistor Q1, a gate electrode of a second transistor Q2, one end of a parallel capacitor C2, and one end of the fourth resistor R4. The gate drive circuit unit 222 may include the first transistor Q1. The first transistor Q1 may be a bipolar junction transistor (BJT), but is not limited thereto. The first transistor Q1 may be a PNP type transistor, but is not limited thereto. The first transistor Q1 may have the base electrode connected to the other end of the second resistor R2 and the anode electrode of the second diode D2. The first transistor Q1 may have the emitter electrode connected to the cathode electrode of the second diode D2, one end of the parallel capacitor C2, one end of the fourth resistor R4, and the gate electrode of the second transistor Q2. The first transistor Q1 may have the collector electrode connected to one end of the third resistor R3. The gate drive circuit unit 222 may include the third resistor R3. The third resistor R3 may have one end connected to the collector electrode of the first transistor Q1 and the other end connected to the first ground electrode GND1. The gate drive circuit unit 222 may include the fourth resistor R4. The fourth resistor R4 may have one end connected to the gate electrode of the second transistor Q2, one end of the parallel capacitor C2, the emitter electrode of the first transistor Q1, and the cathode electrode of the second diode D2. The gate drive circuit unit 222 may include the second transistor Q2. The second transistor Q2 may be a metal oxide silicon field effect transistor (MOSFET), but is not limited thereto. The second transistor Q2 may be a PMOS type transistor, but is not limited thereto. The second transistor Q2 may have a gate electrode connected to the cathode electrode of the second diode D2, the emitter electrode of the first transistor Q1, one end of the fourth resistor R4, and one end of the parallel capacitor C2. The second transistor Q2 may have a drain electrode connected to the other end of the fifth resistor R5. The second transistor Q2 may have a source electrode connected to the first ground electrode GND1. The gate drive circuit unit 222 may include the parallel capacitor C2. The parallel capacitor C2 may be connected in parallel to the gate electrode and the drain electrode of the second transistor Q2. The parallel capacitor C2 may have one end connected to the gate electrode of the second transistor Q2, one end of the fourth resistor R4, the emitter electrode of the first transistor Q1, and the cathode electrode of the second diode D2. The parallel capacitor C2 may have the other end connected to the drain electrode of the second transistor Q2 and the other end of the fifth resistor R5.

The DALI interface 220 according to the embodiment of the present invention may include a second limiting circuit unit 223. The second limiting circuit unit 223 may be a current limiting circuit. The second limiting circuit unit 223 may limit the current caused by various DALI master conditions so as to be suitable for generating the DALI reception (Rx) signal.

The DALI interface 220 according to the embodiment of the present invention may include a fifth resistor R5. The fifth resistor R5 may provide the drain-source voltage $V_{ds}$ generated by the gate drive circuit unit 222 to the rectification unit 224.

The DALI interface 220 according to the embodiment of the present invention may include a second smoothing capacitor C3. The second smoothing capacitor C3 may be used to smooth the current inputted from the rectification unit 224.

The DALI interface 220 according to the embodiment of the present invention may include the rectification unit 224. The rectification unit 224 may provide the DALI signal to the DALI master 300 based on the drain-source voltage $V_{ds}$. The rectification unit 224 may be implemented by a full bridge diode or a half bridge diode.

The DALI interface 220 according to the embodiment of the present invention may include the second photocoupler PC2 which transmits the DALI reception (Rx) signal to the microcontroller 210.

Figure 4:
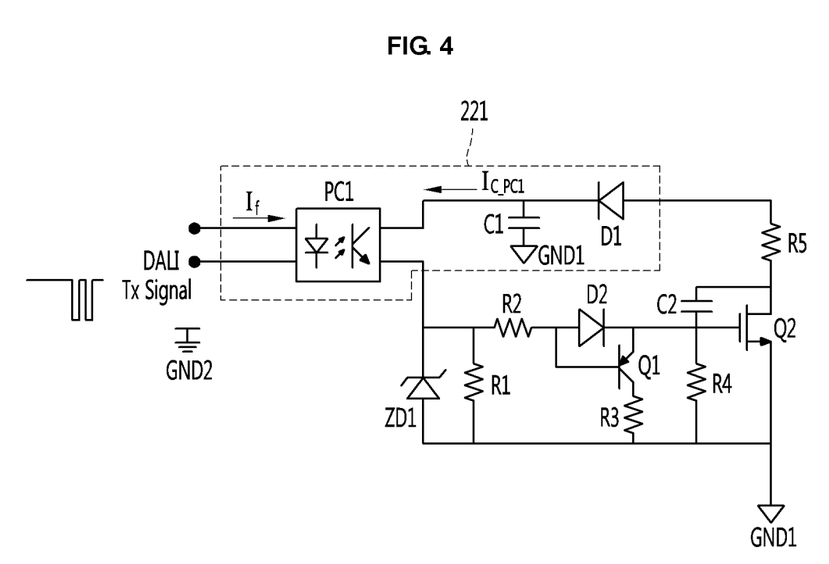
FIG. 4 is a circuit diagram for describing a first limiting circuit unit of the DALI interface according to an embodiment of the present invention.

FIG. 4 is a circuit diagram for describing the first limiting circuit unit of the DALI interface according to an embodiment of the present invention.

Referring to FIG. 4, the DALI interface 220 may receive a DALI transmission (Tx) signal of a high level or a DALI reception (Rx) signal of a high level. In this case, the first smoothing capacitor C1 of the first limiting circuit unit 221 may receive a current through the first diode D1. The first smoothing capacitor C1 may be charged with a voltage obtained by subtracting a driving voltage $V_f$ of the first photocoupler PC1 from a DALI signal maximum voltage $V_{DALI\_max}$ which is a peak value provided from the DALI master. Since the driving voltage $V_f$ is 1 V or less, the first photocoupler PC1 may maintain an off state.

The DALI interface 220 may receive a DALI transmission (Tx) signal of a high level or a DALI reception (Rx) signal of a low level. In this case, the first diode D1 may be turned off. the first smoothing capacitor C1 may maintain a previous state without additional charging or discharging. Since the driving voltage $V_f$ is 1 V or less, the first photocoupler PC1 may maintain an off state.

The DALI interface 220 may receive a DALI transmission (Tx) signal of a low level or a DALI reception (Rx) signal of a high level. In this case, the first diode D1 may be turned off. the first smoothing capacitor C1 may be dis-charged, and thus a charging voltage may be lowered. A driving current $I_f$, which is an input current, may flow through the anode electrode of the first photocoupler PC1. A limited current $I_{C\_PC1}$ may flow through the collector electrode of the first photocoupler PC1. The limited current $I_{C\_PC1}$ may be limited by $I_f$*CTR (Current Transfer Radio).

Figure 5:
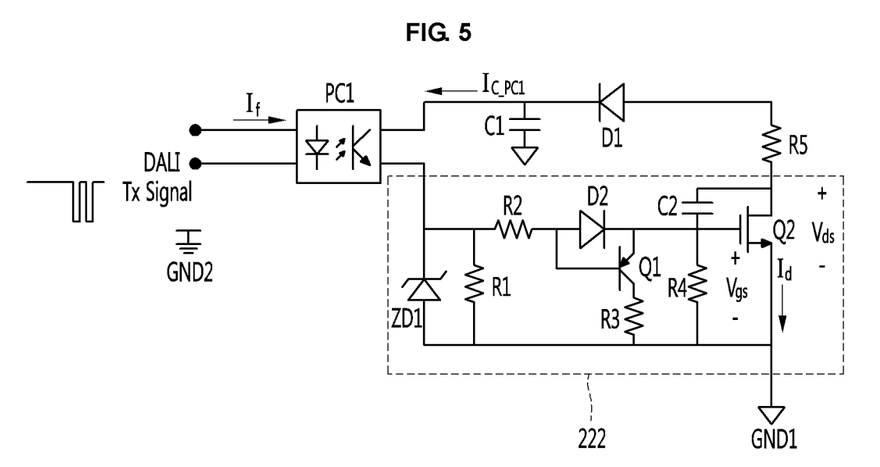
FIG. 5 is a circuit diagram for describing a gate drive circuit unit of the DALI interface according to an embodiment of the present invention.
Figure 6:
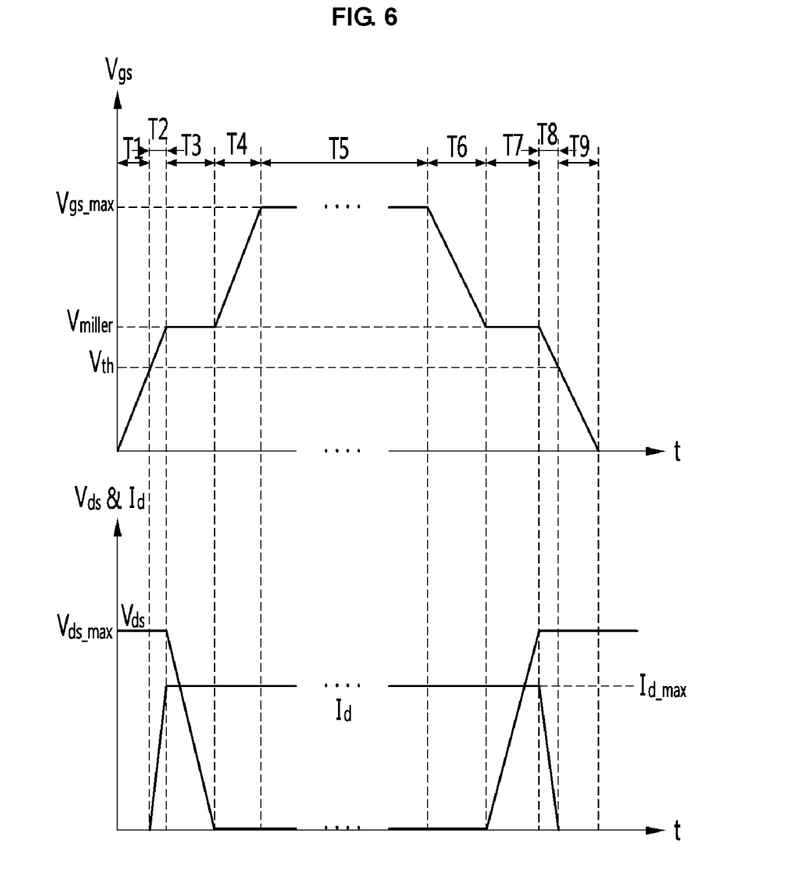
FIG. 6 is a waveform diagram for describing characteristics of a second transistor of the DALI INTERFACE according to an embodiment of the present invention.

FIG. 5 is a circuit diagram for describing the gate drive circuit unit of the DALI interface according to an embodiment of the present invention, and FIG. 6 is a waveform diagram for describing characteristics of the second transistor of the DALI interface according to an embodiment of the present invention.

<First Period: T1>

Referring to FIGS. 5 and 6, a first period T1 may be a period in which a gate-source voltage $V_{gs}$ of the second transistor Q2 increases from 0 V to a threshold voltage $V_{th}$ of the second transistor Q2. More specifically, when the DALI transmission (Tx) signal changes from a high level to a low level, the limited current $I_{C\_PC1}$ of the first photocoupler PC1 may be supplied to the gate electrode of the second transistor Q2 through the second resistor R2 and the second diode D2. The gate-source voltage $V_{gs}$ of the second transistor Q2 may increase due to the limited current $I_{C\_PC1}$. Since the second transistor Q2 is not turned on, the drain-source voltage $V_{ds}$ of the second transistor Q2 may be a drain maximum voltage $D_{ds\_mas}$ according to a maximum supply voltage of the DALI master 300. In addition, a drain current Id of the second transistor Q2 may be 0 V since the second transistor Q2 is not turned on. The first period T1 may be adjusted by the value of the second resistor R2.

<Second Period: T2>

A second period T2 may be a period in which the gate-source voltage $V_{gs}$ of the second transistor Q2 increases from the threshold voltage $V_{th}$ to a Miller voltage $V_{miller}$ of the second transistor Q2. More specifically, the second transistor Q2 may reach the threshold voltage $V_{th}$ and be turned on, and a drain-source channel may be formed. The drain current $I_d$ of the second transistor Q2 may increase from 0 V as the gate-source voltage $V_{gs}$ increases. When the drain current $I_d$ of the second transistor Q2 reaches the drain maximum current $I_{d\_max}$ according to the maximum supply current of the DALI master 300, a Miller effect may be generated by characteristics of the MOSFET, and the gate-source voltage $V_{gs}$ of the second transistor Q2 may be fixed to the Miller voltage $V_{miller}$. The second period T2 may be adjusted by the value of the second resistor R2.

<Third Period: T3>

A third period T3 may be a period in which the gate-source voltage $V_{gs}$ of the second transistor Q2 is maintained at the Miller voltage $V_{miller}$. More specifically, the drain-source voltage $V_{ds}$ of the second transistor Q2 may decrease from the drain maximum voltage $V_{ds\_max}$ to 0 V. As the drain-source voltage $V_{ds}$ of the second transistor Q2 decreases, energy charged in the parallel capacitor C2 may be discharged, and most of the current flowing into the second diode D2 may flow through the parallel capacitor C2. Therefore, the gate-source voltage $V_{gs}$ of the second transistor Q2 may be maintained at the Miller voltage $V_{miller}$. The third period T3 may be adjusted by the value of the parallel capacitor C2 or the second resistor R2. That is, a falling slope of the drain-source voltage $V_{ds}$ of the second transistor Q2 may be adjusted by the value of the parallel capacitor C2 or the second resistor R2. Therefore, the DALI interface 220 according to the present invention may adjust a falling time of the DALI signal by adjusting the falling slope of the drain-source voltage $V_{ds}$ of the second transistor Q2.

<Fourth Period: T4>

A fourth period T4 may be a period in which the gate-source voltage $V_{gs}$ of the second transistor Q2 increases from the Miller voltage $V_{miller}$ to the gate maximum voltage $V_{gs\_max}$. The drain current $I_d$ of the second transistor Q2 may be maintained at the drain maximum current $I_{d\_max}$. The drain-source voltage $V_{ds}$ of the second transistor Q2 may be maintained at the value of [the drain maximum current $(I_{d\_max})$]*[the driving resistance $(R_{ds\_on})$ of the second transistor]. The gate maximum voltage $V_{gs\_max}$ may be determined by characteristics of the Zener diode ZD1 and the value of the second resistor R2 or the fourth resistor R4. The fourth period T4 may be adjusted by the value of the second resistor R2.

<Fifth Period: T5>

A fifth period T5 may be a period in which the second transistor Q2 is completely turned on. The drain current $I_d$ of the second transistor Q2 may be maintained at the drain maximum current $I_{d\_max}$. The drain-source voltage $V_{ds}$ of the second transistor Q2 may be maintained at the value of [the drain maximum current $(I_{d\_max})$]*[the driving resistance $(_{Rds\_on})$ of the second transistor].

<Sixth Period: T6>

A sixth period T6 may be a period in which the gate-source voltage $V_{gs}$ of the second transistor Q2 decreases from the gate maximum voltage $V_{gs\_max}$ to the Miller voltage $V_{miller}$. More specifically, when the DALI transmission (Tx) signal changes from a low level to a high level, the limited current $I_{C\_PC1}$ of the first photocoupler PC1 may rapidly decreases, and a voltage $V_{R1}$ applied across both ends of the first resistor R1 may decrease. Then, the first transistor Q1 may be turned on, and the gate-source voltage $V_{gs}$ of the second transistor may decrease. Even when the gate-source voltage $V_{gs}$ of the second transistor Q2 decreases from the gate maximum voltage $V_{gs\_max}$ to the Miller voltage, the drain current $I_d$ and the drain-source voltage $V_{ds}$ of the second transistor Q2 may maintain a previous state value. That is, the drain current $I_d$ of the second transistor Q2 may be maintained at the drain maximum current $I_{d\_max}$. The drain-source voltage $V_{ds}$ of the second transistor Q2 may be maintained at the value of [the drain maximum current $(I_{d\_max})$]*[the driving resistance $(R_{ds\_on})$ of the second transistor]. The sixth period T6 may be adjusted by the current flowing through the base electrode of the first transistor Q1 or the value of the third resistor R3.

<Seventh Period: T7>

A seventh period T7 may be a period in which the gate-source voltage $V_{gs}$ of the second transistor Q2 is maintained at the Miller voltage $V_{miller}$. More specifically, the drain-source voltage $V_{ds}$ of the second transistor Q2 may increase from the value of [the drain maximum current $(I_{d\_max})$]*[the driving resistance $(R_{ds\_on})$ of the second transistor] to the drain maximum voltage $V_{ds\_max}$. As the drain-source voltage $V_{ds}$ of the second transistor Q2 increases, energy is charged in the parallel capacitor C2, and at the same time, the current flowing into the parallel capacitor C2 may flow through the first transistor Q1. Therefore, the gate-source voltage $V_{gs}$ of the second transistor Q2 may be maintained at the Miller voltage $V_{miller}$. The seventh period T7 may be adjusted by the value of the parallel capacitor C2 or the third resistor R3. That is, a rising slope of the drain-source voltage $V_{ds}$ of the second transistor Q2 may be adjusted by the value of the parallel capacitor C2 or the third resistor R3. Therefore, the DALI interface 220 according to the present invention may adjust a rising time of the DALI signal by adjusting the rising slope of the drain-source voltage $V_{ds}$ of the second transistor Q2.

<Eighth Period: T8>

An eighth period T8 may be a period in which the gate-source voltage $V_{gs}$ of the second transistor Q2 decreases from the Miller voltage $V_{miller}$ to the threshold voltage $V_{th}$. More specifically, the gate-source voltage $V_{gs}$ of the second transistor Q2 may reach the threshold voltage $V_{th}$, the second transistor Q2 may be turned off, and the drain-source channel may disappear. The drain current $I_d$ of the second transistor Q2 may decrease to 0 V as the gate-source voltage $V_{gs}$ decreases. The eighth period T8 may be adjusted by the current flowing through the base electrode of the first transistor Q1 or the value of the third resistor R3.

<Ninth Period: T9>

A ninth period T9 may be a period in which the gate-source voltage $V_{gs}$ of the second transistor Q2 decreases from the threshold voltage $V_{th}$ to 0 V. Since the second transistor Q2 is in the turned-off state, the drain-source voltage $V_{ds}$ and the drain current $I_d$ of the second transistor Q2 may maintain the previous state values. That is, the drain-source voltage $V_{ds}$ of the second transistor Q2 may be the drain maximum voltage $V_{ds\_max}$, and the drain current $I_d$ may be 0 V. The ninth period T9 may be adjusted by the current flowing through the base electrode of the first transistor Q1 or the value of the third resistor R3.

Therefore, even when various ranges of the supply voltage of the DALI master 300 are provided, the DALI interface 220 according to the embodiment of the present invention may generate the DALI signal suitable for the DALI standard by changing the component values of the gate drive circuit unit 222. In addition, even when component deviation occurs in the first photocoupler PC1, the DALI interface 220 according to the embodiment of the present invention may generate the DALI signal suitable for the DALI standard by changing the component values of the gate drive circuit unit 222. That is, the DALI interface 220 according to the embodiment of the present invention is capable of adjusting waveform characteristics such as the rising time, the falling time, and the low-pulse width of the DALI signal so as to be suitable for the DALI standard.

Figure 7:
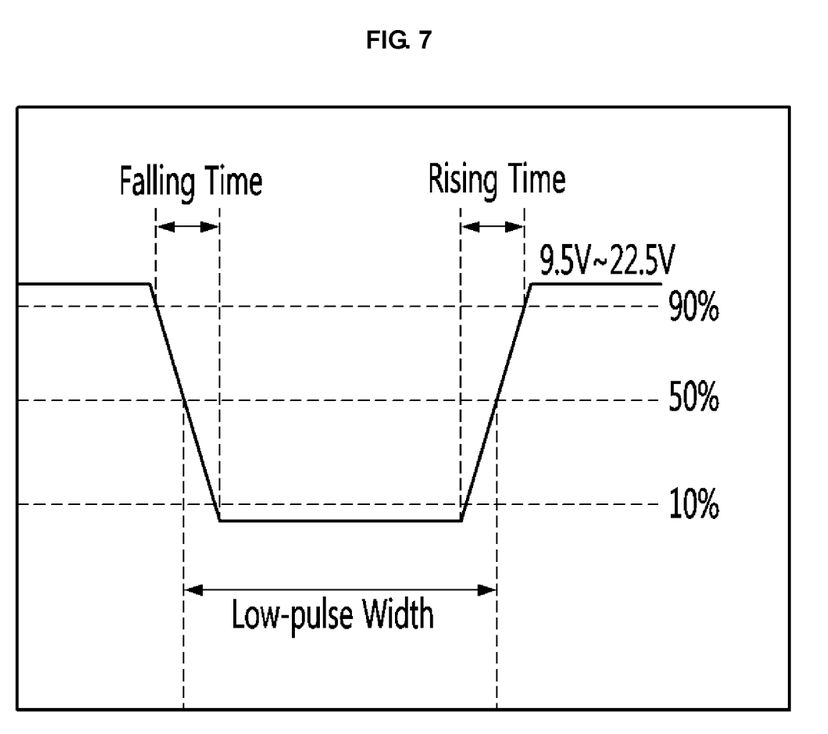
FIG. 7 is a standard waveform diagram of a DALI signal according to a DALI protocol.
Figure 8:
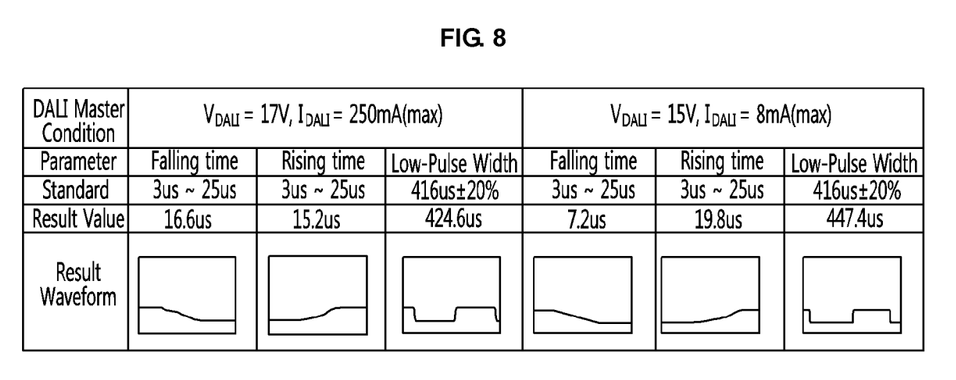
FIG. 8 is test result according to an embodiment of the present invention.

FIG. 7 is a standard waveform diagram of the DALI signal according to the DALI protocol, and FIG. 8 is a test result according to the embodiment of the present invention.

Referring to FIG. 7, the DALI signal should satisfy waveform characteristics according to the standard. The DALI signal must have a falling time of 3 µs to 25 µs. The DALI signal must have a rising time of 3 µs to 25 µs. The DALI signal must have a low-pulse width of 416 µs and an error range of about 20%.

FIG. 8 is a test result when the DALI signals suitable for the DALI standard are generated in different conditions of the DALI master 300 by using the DALI interface 220 according to the present invention.

In the case of a first test, the condition of the DALI master 300 is that a DALI voltage $V_{DAU}$ has a maximum value of 17 V, and a DALI current $I_{DAU}$ has a maximum value of 250 mA. The DALI interface 220 according to the present invention generated the DALI signal having a falling time of 16.6 µs, a rising time of 15.2 µs, and a low-pulse width of 426.6 µs in the first test condition. Therefore, the DALI interface 220 according to the present invention may generate the DALI signal suitable for the DALI standard in the first test condition.

In the case of a second test, the condition of the DALI master 300 is that a DALI voltage $V_{DAU}$ has a maximum value of 15V, and a DALI current $I_{DAU}$ has a maximum value of 8 mA. The DALI interface 220 according to the present invention generated the DALI signal having a falling time of 7.2 µs, a rising time of 19.8 µs, and a low-pulse width of 447.4 µs in the second test condition. Therefore, the DALI interface 220 according to the present invention may generate the DALI signal suitable for the DALI standard in the second test condition.

It will be understood by those skilled in the art that the present invention can be embodied in other specific forms without departing from the spirit or essential characteristics thereof. It is therefore to be understood that the above-described embodiments are illustrative in all aspects and not restrictive.

The scope of the present invention is defined by the appended claims rather than the foregoing description, and all changes or modifications derived from the meaning and scope of the claims and their equivalents should be construed as falling within the scope of the present invention.

The invention claimed is:

1. A Digital Addressable Lighting Interface (DALI) interface comprising:
    a first limiting circuit unit for outputting a limited current based on a DALI transmission signal and a DALI reception signal; and
    a gate drive circuit unit for generating, based on the limited current, a drain-source voltage that is used for generating a DALI signal in accordance with a DALI standard,
    wherein the first limiting circuit unit comprises:
        a first photocoupler for receiving the DALI transmission signal,
        a first diode having a cathode electrode connected to a collector electrode of the first photocoupler, and
    wherein the gate driver comprises:
        a Zener diode having a cathode electrode connected to an emitter electrode of the first photocoupler,
        a second diode having an anode electrode connected to a cathode electrode of the Zener diode, and
        a first transistor having a gate electrode connected to a cathode electrode of the second diode, a drain electrode connected to an anode electrode of the first diode, and a source electrode connected to a ground electrode.

2. The DALI interface according to claim 1, wherein the first transistor is configured to generate and output the drain-source voltage.

3. The DALI interface according to claim 2, wherein the gate drive circuit unit comprises a parallel capacitor having a first end connected to the gate electrode of the first transistor and a second end connected to the drain electrode of the first transistor.

4. The DALI interface according to claim 3, wherein the parallel capacitor is configured to adjust a falling time and a rising time of the DALI signal.

5. The DALI interface according to claim 2, wherein the gate drive circuit unit comprises a second transistor for controlling the first transistor, and
    wherein the second transistor has a base electrode connected to the anode electrode of the second diode, an emitter electrode connected to the gate electrode of the first transistor, and a collector electrode connected to the ground electrode.

6. The DALI interface according to claim 1, wherein the Zener diode allows a constant voltage to be inputted with regard to the limited current.

7. The DALI interface according to claim 1, further comprising a rectification unit for generating the DALI signal based on the drain-source voltage, and
    wherein the rectification unit is connected to the anode electrode of the first diode.

8. The DALI interface according to claim 7, wherein the rectification unit is a full bridge diode or a half bridge diode.

9. The DALI interface according to claim 7, further comprising a second smoothing capacitor for smoothing a current inputted to the rectification unit.

10. The DALI interface according to claim 7, further comprising a fifth resistor,
    wherein the fifth resistor has a first end connected to the drain electrode of the first transistor and a second end connected to the anode electrode of the first diode and the rectification unit.

11. The DALI interface according to claim 1, wherein the first limiting circuit unit comprises a first smoothing capacitor having one end connected to the collector electrode of the first photocoupler and the cathode electrode of the first diode and the other end connected to the ground electrode.

12. A power device comprising:
    a microcontroller for outputting a Digital Addressable Lighting Interface (DALI) transmission signal and receiving a DALI reception signal; and
    a DALI interface comprising a first limiting circuit unit for outputting a DALI signal in accordance with a DALI standard and outputting a limited current based on the DALI transmission signal and the DALI reception signal, and a gate drive circuit unit for generating, based on the limited current, a drain-source voltage that is used for generating the DALI signal in accordance with the DALI standard,
    wherein the first limiting circuit unit comprises:
        a first photocoupler for receiving the DALI transmission signal,
        a first diode having a cathode electrode connected to a collector electrode of the first photocoupler, and
    wherein the gate driver comprises:
        a Zener diode having a cathode electrode connected to an emitter electrode of the first photocoupler,
        a second diode having an anode electrode connected to a cathode electrode of the Zener diode, and
        a first transistor having a gate electrode connected to a cathode electrode of the second diode, a drain electrode connected to an anode electrode of the first diode, and a source electrode connected to a ground electrode.

13. The power device according to claim 12, wherein the first transistor is configured to generate the drain-source voltage and output the drain-source voltage.

14. The power device according to claim 13, wherein the gate drive circuit unit comprises a parallel capacitor connected to the gate electrode and the drain electrode of the first transistor and adjusting a falling time and a rising time of the DALI signal.

15. The power device according to claim 13, wherein the gate drive circuit unit comprises a second transistor for controlling the first transistor, and
    wherein the second transistor has a base electrode connected to the anode electrode of the second diode, an emitter electrode connected to the gate electrode of the first transistor, and a collector electrode connected to the ground electrode.

* * * * *